(12) United States Patent
Tandou et al.

(10) Patent No.: US 9,368,377 B2
(45) Date of Patent: Jun. 14, 2016

(54) PLASMA PROCESSING APPARATUS

(75) Inventors: Takumi Tandou, Asaka (JP); Kenetsu Yokogawa, Tsurugashima (JP); Masaru Izawa, Hino (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 1174 days.

(21) Appl. No.: 11/836,219

(22) Filed: Aug. 9, 2007

(65) Prior Publication Data

US 2008/0289767 A1    Nov. 27, 2008

(30) Foreign Application Priority Data

May 23, 2007 (JP) ................. 2007-136870

(51) Int. Cl.

| | |
|---|---|
| *H01L 21/67* | (2006.01) |
| *H01L 21/683* | (2006.01) |
| *H01J 37/32* | (2006.01) |
| *C23C 16/46* | (2006.01) |
| *F25B 41/06* | (2006.01) |

(52) U.S. Cl.
CPC ........ *H01L 21/67109* (2013.01); *C23C 16/463* (2013.01); *F25B 41/062* (2013.01); *H01J 37/32431* (2013.01); *H01L 21/6831* (2013.01); *H01J 2237/2001* (2013.01); *H01L 2924/0002* (2013.01)

(58) Field of Classification Search
CPC .................. H01L 21/67109; H01L 21/6831; H01L 2924/0002; F25B 41/062; H01J 37/32431; H01J 2237/2001; C23C 16/463
See application file for complete search history.

(56) References Cited

U.S. PATENT DOCUMENTS

| | | | | |
|---|---|---|---|---|
| 4,474,026 | A * | 10/1984 | Mochizuki et al. | ............. 62/157 |
| 4,573,497 | A * | 3/1986 | White | ...................... 137/625.29 |
| 6,041,605 | A * | 3/2000 | Heinrichs | .......................... 62/84 |
| 6,332,324 | B1 * | 12/2001 | Saho et al. | ..................... 62/51.1 |

(Continued)

FOREIGN PATENT DOCUMENTS

| | | |
|---|---|---|
| JP | 05-079713 | 3/1993 |
| JP | 06-346256 | * 12/1994 |

(Continued)

OTHER PUBLICATIONS

Japanese Official Action dated Mar. 19, 2013, for JP Application No. 2011-223960.

*Primary Examiner* — Jeffrie R Lund
(74) *Attorney, Agent, or Firm* — Baker Botts L.L.P.

(57) ABSTRACT

The present invention provides a temperature control unit for an electrostatic adsorption electrode that is capable of controlling the wafer temperature rapidly over a wide temperature range without affecting in-plane uniformity while high heat input etching is conducted with high wafer bias power applied. A refrigerant flow path provided in the electrostatic adsorption electrode serves as an evaporator. The refrigerant flow path is connected to a compressor, a condenser, and a first expansion valve to form a direct expansion type refrigeration cycle. A second expansion valve is installed between the electrostatic adsorption electrode and the compressor to adjust the flow rate of a refrigerant. This makes it possible to compress the refrigerant in the refrigerant flow path of the electrostatic adsorption electrode and adjust the wafer temperature to a high level by raising the refrigerant evaporation temperature. Further, a thin-walled cylindrical refrigerant flow path is employed so that the thin-walled cylinder is deformed only slightly by the refrigerant pressure.

7 Claims, 11 Drawing Sheets

(56) References Cited

U.S. PATENT DOCUMENTS

| | | | |
|---|---|---|---|
| 6,385,980 B1 * | 5/2002 | Sienel | 62/174 |
| 6,664,738 B2 * | 12/2003 | Arai et al. | 315/111.21 |
| 6,853,533 B2 * | 2/2005 | Parkhe | 361/234 |
| 6,938,432 B2 | 9/2005 | Enomoto | |
| 6,993,919 B2 | 2/2006 | Hirooka et al. | |
| 2003/0126875 A1 | 7/2003 | Enomoto | |
| 2004/0250568 A1 * | 12/2004 | Sienel | 62/513 |
| 2005/0034473 A1 * | 2/2005 | Casar et al. | 62/324.1 |
| 2005/0045104 A1 | 3/2005 | Arai et al. | |
| 2006/0080989 A1 * | 4/2006 | Aoki et al. | 62/324.4 |
| 2006/0266057 A1 * | 11/2006 | Yakumaru et al. | 62/160 |
| 2007/0068178 A1 * | 3/2007 | Honma et al. | 62/160 |
| 2007/0081296 A1 * | 4/2007 | Brillhart et al. | 361/234 |
| 2007/0091537 A1 | 4/2007 | Buchberger, Jr. et al. | |
| 2008/0023448 A1 * | 1/2008 | Tandou | H01L 21/67109 219/121.36 |
| 2008/0178608 A1 * | 7/2008 | Tandou | F25B 39/02 62/6 |
| 2008/0289767 A1 * | 11/2008 | Tandou et al. | 156/345.53 |
| 2009/0277883 A1 * | 11/2009 | Tandou | H01J 37/32623 219/121.49 |
| 2010/0126666 A1 * | 5/2010 | Tandou et al. | 156/345.27 |
| 2011/0132541 A1 * | 6/2011 | Tandou | H01L 21/67017 156/345.27 |
| 2012/0186745 A1 * | 7/2012 | Miya | H01J 37/32715 156/345.27 |
| 2014/0004706 A1 * | 1/2014 | Miya | H01L 21/3065 438/710 |
| 2014/0283534 A1 * | 9/2014 | Tandou et al. | 62/62 |

FOREIGN PATENT DOCUMENTS

| | | | |
|---|---|---|---|
| JP | 2000-130890 | * | 5/2000 |
| JP | 2000-304332 | * | 11/2000 |
| JP | 3377830 | | 12/2002 |
| JP | 2003-269809 | | 9/2003 |
| JP | 2005-79539 | | 3/2005 |
| JP | 2005-085801 | | 3/2005 |
| JP | 2005-085803 | | 3/2005 |
| JP | 2005-089864 | * | 4/2005 |
| JP | 2007-116099 | | 5/2007 |
| WO | WO 2004/025199 | | 3/2004 |

* cited by examiner

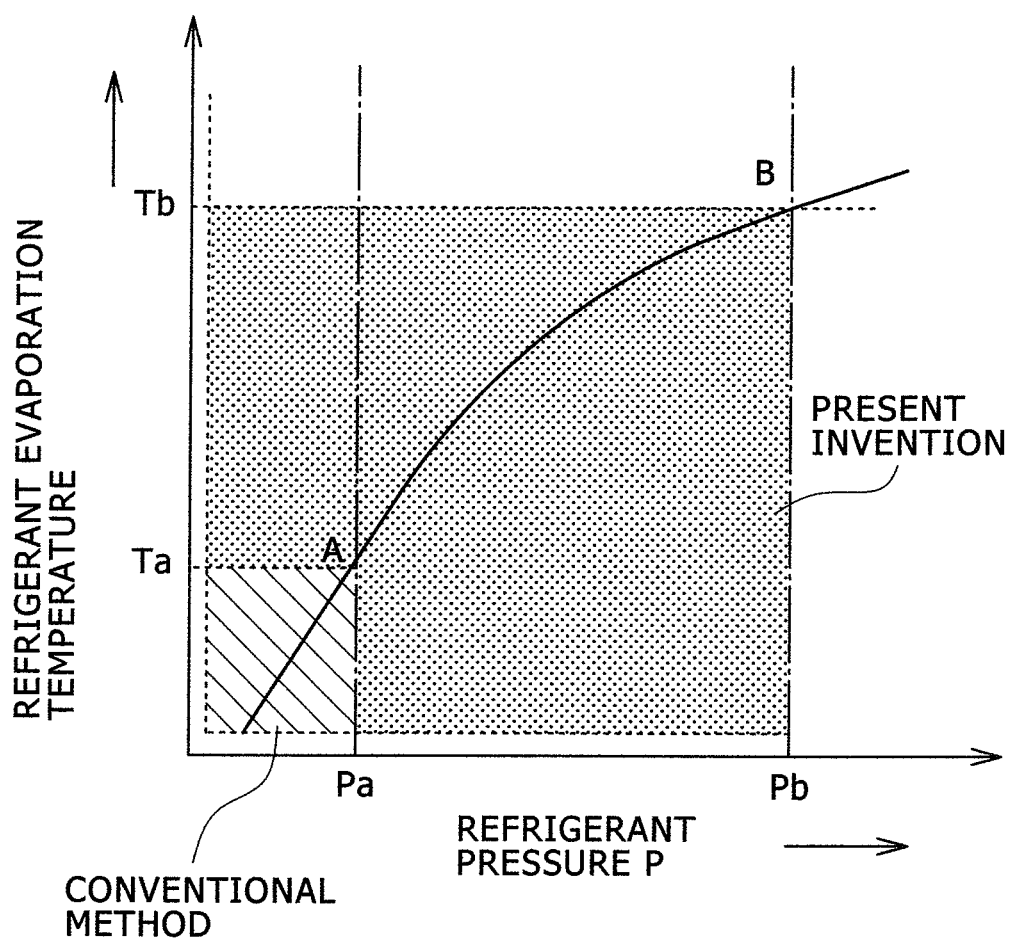

※Pa<Pb<Pc

REFRIGERANT OUTLET  REFRIGERANT INLET

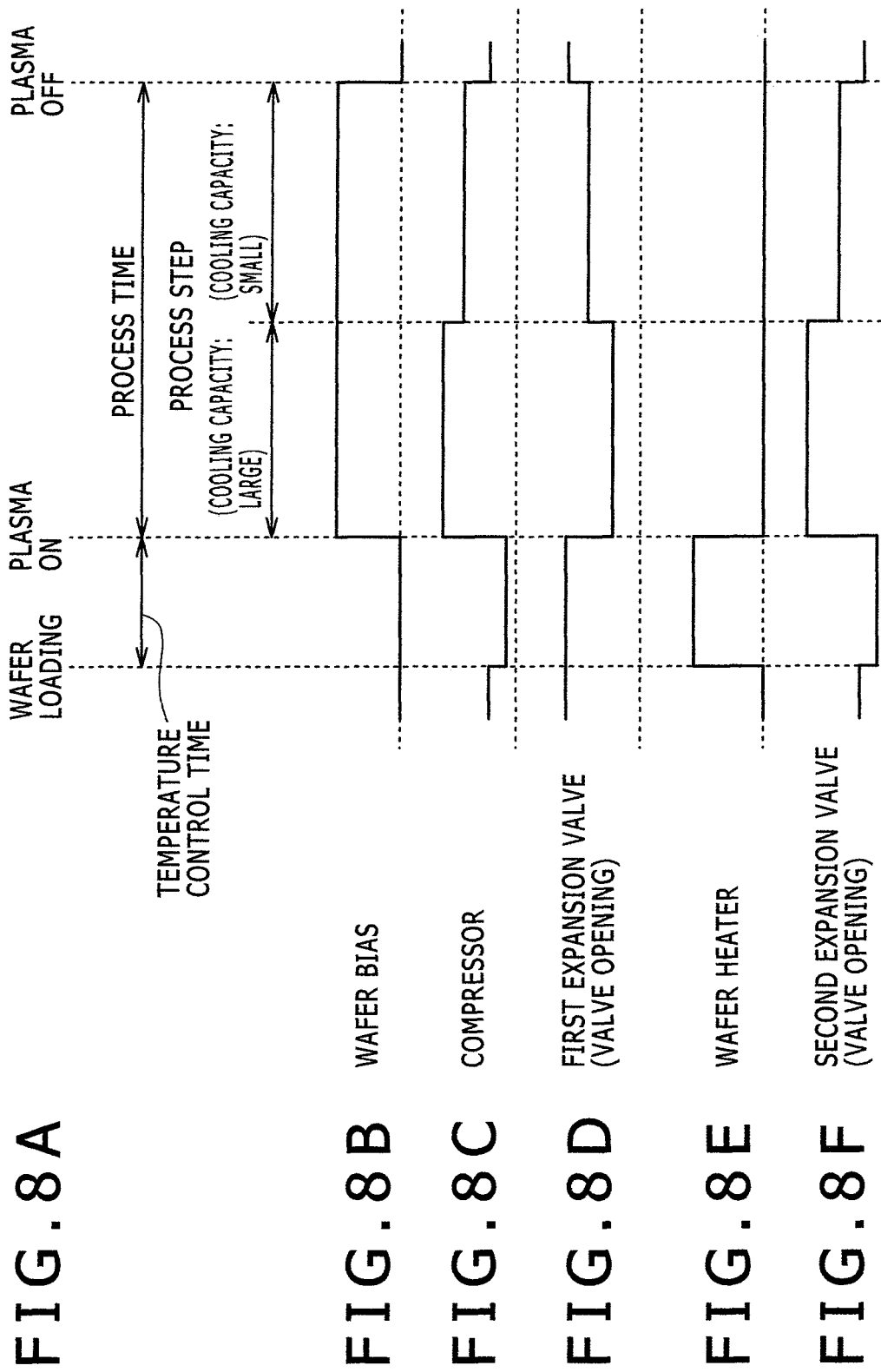

PLASMA PROCESSING APPARATUS

CLAIM OF PRIORITY

The present invention application claims priority from Japanese application JP2007-136870 filed on May 23, 2007, the content of which is hereby incorporated by reference into this application.

BACKGROUND OF THE INVENTION (1) Field of the Invention

The present invention relates to a plasma processing apparatus that provides microfabrication in a semiconductor manufacturing process, and more particularly to a plasma processing apparatus having a temperature control unit for exercising temperature control over an electrode section that retains and locks a semiconductor wafer.

(2) Description of the Related Art

Temperature management of a currently processed wafer is important when a plasma processing apparatus processes the micropattern of a wafer surface with high precision. If the wafer surface temperature can be optimally controlled in accordance with the progress of a process, it is possible to not only increase processing accuracy but also enhance selectivity and throughput. At present, the high-frequency power applied to the plasma processing apparatus tends to increase with an increase, for instance, in the area of a wafer. For dielectric film etching, particularly, large power on the order of kilowatts is applied to increase the etching rate. When large power is applied, the ion impact energy relative to the wafer increases to increase the heat input to the wafer. Since the heat input to the wafer is increased as described above, an electrostatic adsorption electrode for retaining the wafer for temperature adjustment purposes needs a temperature control unit that supports high heat input and high-speed temperature control.

When the wafer temperature is to be controlled within the plasma processing apparatus, the temperature of the electrostatic adsorption electrode, which comes into contact with a wafer back surface, should be controlled. When a conventional electrostatic adsorption electrode is used, the electrode temperature is controlled by forming a refrigerant flow path within the electrode and causing a liquid refrigerant (e.g., Fluorinert (registered trademark)) to flow in the flow path. The liquid refrigerant is adjusted to a target temperature by a cooling device or heating device in a refrigerant supply unit (e.g., chiller unit) and then supplied to the electrode flow path. The aforementioned refrigerant supply unit is structured so as to store the liquid refrigerant in a tank and then discharge the liquid refrigerant after temperature adjustment. Since the liquid refrigerant has a large heat capacity, the refrigerant supply unit is instrumental in maintaining a constant wafer surface temperature. However, the refrigerant supply unit is poor in temperature response, cannot readily provide high-speed temperature control, and has low thermal efficiency. Therefore, it is demanded that the size of the refrigerant supply unit be increased to provide support for recent heat input increase.

Under the above circumstances, a direct expansion type refrigerant supply unit is proposed. The electrostatic adsorption electrode of the proposed refrigerant supply unit is provided with a compressor, which uses a refrigerant circulation system to pressurizes the refrigerant; a condenser, which condenses the pressurized refrigerant; and an expansion valve, which expands the refrigerant. The proposed refrigerant supply unit uses evaporative latent heat of the refrigerant to cool the electrostatic adsorption electrode. The direct expansion type refrigerant supply unit (or refrigeration cycle) makes it possible to control the semiconductor wafer temperature prevailing during a high heat input etching process at high speed and with high efficiency.

A method proposed, for instance, by Japanese Patent No. 3377830 adjusts the refrigerant evaporation temperature in the electrostatic adsorption electrode to a high temperature by sending a high-temperature refrigerant from a high-pressure side to a low-pressure side directly (without via a condenser or expansion valve).

A method proposed, for instance, by Japanese Patent Application Laid-Open Publication No. 2005-89864 heats the refrigerant with a heater installed in a refrigerant supply path to the electrostatic adsorption electrode.

SUMMARY OF THE INVENTION

The direct expansion type refrigerant supply unit provides cooling by making use of latent heat that is generated when the refrigerant evaporates from liquid to vapor, and can control the refrigerant evaporation temperature by means of pressure. A common refrigerant pressure control method is to adjust the opening of the expansion valve. However, the expansion valve functions to reduce the refrigerant temperature in the electrostatic adsorption electrode (evaporator) and cannot compress the refrigerant to raise the pressure. A major reason is that the direct expansion type refrigeration cycle needs a low-pressure side (evaporator), which expands the refrigerant and absorbs heat by making use of evaporative latent heat, and a high-pressure side (condenser), which exhausts heat by compressing the refrigerant. Therefore, it is difficult to adjust the evaporation temperature of the refrigerant in the electrostatic adsorption electrode to a high temperature so that the refrigerant temperature control range is limited to the low-pressure side. Thus, a direct expansion type temperature control unit for the electrostatic adsorption electrode is at a disadvantage in that its operating temperature range is narrow. Further, even if the refrigerant can be compressed in the electrostatic adsorption electrode, it is anticipated that the electrostatic adsorption electrode might deform due to a refrigerant pressure rise (thereby affecting the electrostatic adsorption force of the wafer).

Concerning the above problem, the method for adjusting the refrigerant evaporation temperature in the electrostatic adsorption electrode to a high temperature by directly sending a high-temperature refrigerant from the high-pressure side to the low-pressure side, which is disclosed by Japanese Patent No. 3377830, makes it possible to reduce the pressure difference between the low-pressure side and high-pressure side and raise the refrigerant evaporation temperature in the electrostatic adsorption electrode to a point where no expansion or compression occurs (to room temperature if there is no heat input). However, the compressor takes in the refrigerant in the cycle while at the same time discharging the refrigerant from the cycle. Thus, the above method cannot readily adjust the refrigerant evaporation temperature to a high temperature close to a condensation temperature because it cannot easily compress the refrigerant in the electrostatic adsorption electrode.

More specifically, there is a method for sending a high-temperature refrigerant from the high-pressure side to the low-pressure side directly (without via the condenser or expansion valve) through the use of a guiding branch 13, which is provided as shown in FIG. 11, and adjusting the refrigerant evaporation temperature in the electrostatic adsorption electrode 1 to a high temperature. This method makes it possible to reduce the pressure difference between the low-pressure side and high-pressure side and raise the refrigerant evaporation temperature in the electrostatic adsorption electrode 1 to a point where no expansion or compression occurs (to room temperature if there is no heat input). However, the compressor 7 takes in the refrigerant in the cycle while at the same time discharging the refrigerant from the cycle. Thus, the above method cannot readily adjust the refrigerant evaporation temperature to a high temperature close to the condensation temperature because it cannot easily compress the refrigerant in the electrostatic adsorption electrode 1. Further, no heat source is available except for heat input from plasma during wafer processing. Therefore, it is impossible to heat (e.g., preheat) the electrostatic adsorption electrode 1 by switching from a direct expansion type system to a heating cycle.

On the other hand, the method for heating the refrigerant with a heater installed in the refrigerant supply path to the electrostatic adsorption electrode, which is disclosed by Japanese Patent Application Laid-Open Publication No. 2005-89864, makes it possible to adjust the degree of refrigerant dryness and control the cooling capacity. However, this method cannot control the refrigerant evaporation temperature because the heater cannot control the refrigerant pressure.

An object of the present invention is to provide a plasma processing apparatus that is capable of controlling the wafer temperature over a wide temperature range during an etching process.

Another object of the present invention is to provide a plasma processing apparatus having a temperature control unit for an electrostatic adsorption electrode that is capable of controlling the wafer temperature rapidly over a wide temperature range without affecting in-plane uniformity while high heat input etching is conducted with high wafer bias power applied.

In accomplishing the above objects, according to one embodiment of the present invention, there is provided a plasma processing apparatus for processing a sample mounted on a sample holding table by plasma, the plasma processing apparatus comprising: a refrigeration cycle including a compressor and a condenser, wherein the refrigeration cycle further comprising: a refrigerant flow path provided in the sample holding table to function as an evaporator of the refrigeration cycle; a first expansion valve connected between an inlet of the refrigerant flow path and an outlet of the condenser; and a second expansion valve connected between an outlet of the refrigerant flow path and an inlet of the compressor.

One feature of the present invention makes it possible to provide a temperature control unit for an electrostatic adsorption electrode that is capable of controlling the wafer temperature over a wide temperature range while high heat input etching is conducted with high wafer bias power applied.

Another feature of the present invention makes it possible to provide a plasma processing apparatus having a temperature control unit for an electrostatic adsorption electrode that is capable of controlling the wafer temperature rapidly over a wide temperature range without affecting in-plane uniformity while high heat input etching is conducted with high wafer bias power applied.

BRIEF DESCRIPTION OF THE DRAWINGS

These and other features, objects and advantages of the present invention will become more apparent from the following description when taken in conjunction with the accompanying drawings wherein:

FIG. 2 illustrates the operations and advantages of the present invention;

FIGS. 8A to 8F are typical timing diagrams illustrating a plasma process according to a sixth embodiment of the present invention;

DETAILED DESCRIPTION OF THE PREFERRED EMBODIMENTS

A representative embodiment of the present invention can compress a refrigerant in a refrigerant flow path within an electrostatic adsorption electrode by adjusting the refrigerant flow rate with a second expansion valve installed in the refrigerant flow path between the electrostatic adsorption electrode and a compressor, and adjust the wafer temperature to a high level by raising the refrigerant evaporation temperature.

Embodiments of the present invention will now be described.

[First Embodiment]

Figure 1:
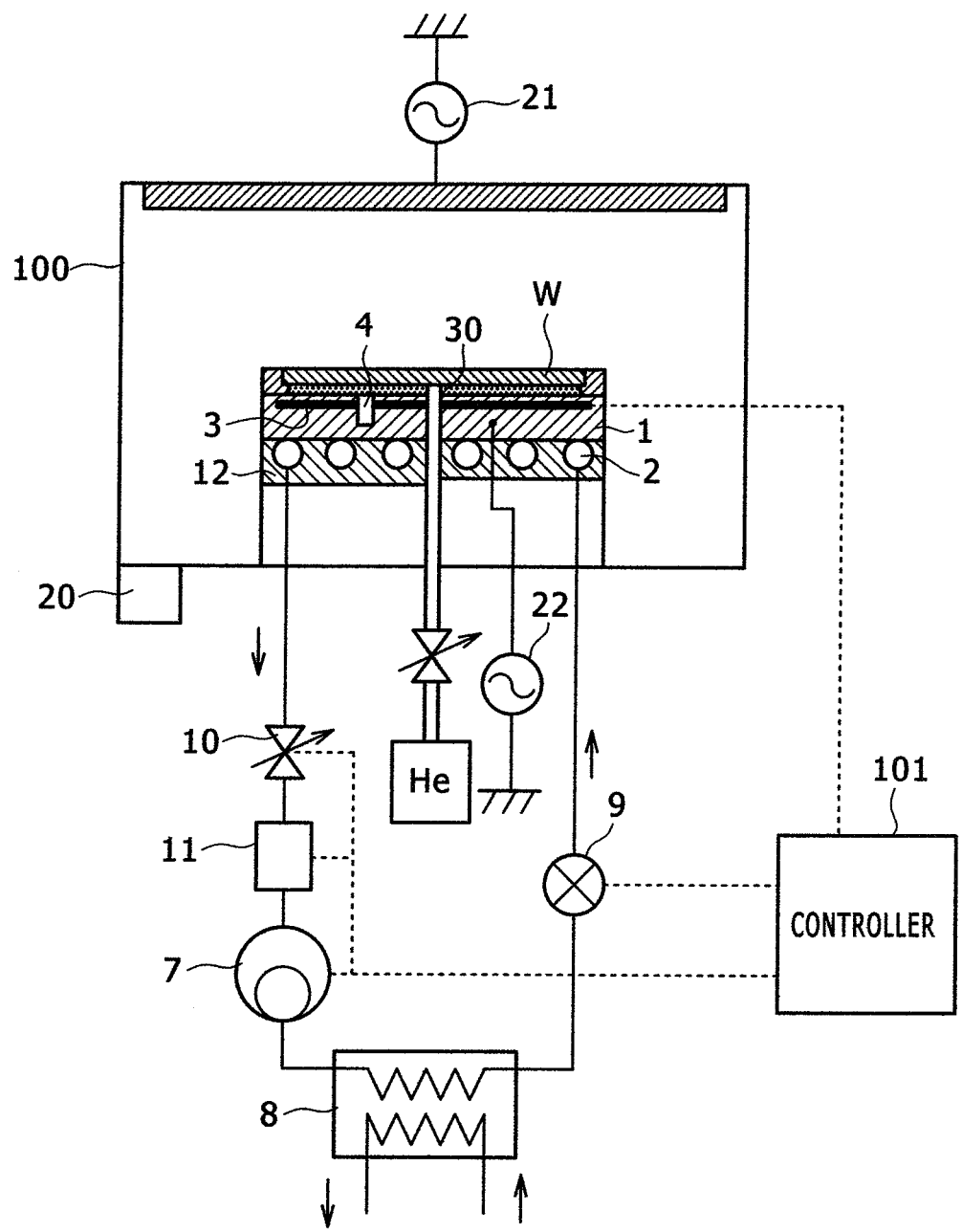
FIG. 1 is a schematic diagram illustrating the configuration of a plasma processing apparatus having a temperature control unit according to a first embodiment of the present invention.

FIG. 1 is a schematic diagram illustrating the configuration of a plasma processing apparatus having a temperature control unit according to a first embodiment of the present invention. The plasma processing apparatus having a temperature control unit has a processing chamber 100. The processing chamber 100 includes an electrostatic adsorption electrode 1 having an electrostatic adsorption insulation thin film on which a wafer W is to be mounted as a sample; an evacuation system 20 for evacuating the processing chamber 100; an antenna power supply 21 for applying high-frequency power for plasma generation to the processing chamber 100; a process gas supply system (not shown) for supplying a process gas for plasma generation to the processing chamber 100; a bias power supply 22 for applying high-frequency power for biasing to the electrostatic adsorption electrode 1; and a He gas supply system 30 for supplying a heat transfer gas to a gap between the electrostatic adsorption insulation thin film and wafer W. A wafer heater 3 and a temperature sensor 4 are built in the electrostatic adsorption electrode 1. An electrode internal refrigerant flow path (hereinafter simply referred to as the refrigerant flow path) 2 is formed in a base material 12, which is positioned below the electrostatic adsorption electrode 1 and composed of an electrical insulation material and thermal insulation material. The refrigerant flow path 2 has an inlet and outlet for supplying or discharging a cooling refrigerant. A first expansion valve 9 is connected to the inlet of the refrigerant flow path 2 via a refrigerant line. A second expansion valve 10 is connected to the outlet of the refrigerant flow path 2 via a refrigerant line. The refrigerant flow path 2 is used as an evaporator to form a direct expansion type refrigeration cycle (or a direct expansion type heat cycle), which includes a compressor 7, a condenser 8, the first expansion valve 9, and the second expansion valve 10. A refrigerant heater 11 is positioned in the refrigerant line between the second expansion valve 10 and compressor 7. The refrigerant heater 11 has a capacity, for instance, of 2 to 4 kW. Cooling water is supplied to the condenser 8. The first expansion valve 9 and the second expansion valve 10 are both variable-capacity valves whose opening (restriction) is pulse motor controlled.

The reference numeral 101 denotes a temperature control system that controls the temperature of the direct expansion type refrigeration cycle. This temperature control system 101 controls the temperature of a wafer mounting surface of the electrostatic adsorption electrode 1 by controlling the wafer heater 3 and direct expansion type refrigeration cycle in accordance with wafer processing conditions and a value detected by the temperature sensor 4. While an etching process is performed, the temperature of the wafer W rises due to high heat input by plasma. As described later, the direct expansion type refrigeration cycle controls the refrigerant temperature in the refrigerant flow path 2 during plasma processing to control the wafer temperature, by controlling the rotation speed of the compressor 7, the openings of the first expansion valve 9 and second expansion valve 10, and the capacity of the refrigerant heater 11.

The direct expansion type refrigeration cycle provides cooling by making use of latent heat that is generated when the refrigerant evaporates from liquid to vapor, and can control the refrigerant evaporation temperature by means of pressure. The present invention is characterized by the fact that at least either the first expansion valve 9, which is positioned upstream of the refrigerant flow path 2 that functions as the evaporator, or the second expansion valve 10, which is positioned downstream of the refrigerant flow path 2, is used to control the refrigerant pressure over a wide range.

As shown in FIG. 2, the electrode internal refrigerant flow path was conventionally controlled over a range below point A (refrigerant pressure Pa, refrigerant temperature Ta). However, the present invention can provide control over a wide range including point B (refrigerant pressure Pb, refrigerant temperature Tb), that is, including a high-pressure, high-temperature region. For example, the refrigerant temperature Ta at point A is 20° C., the refrigerant temperature Tb at point B is 50° C., and the refrigerant pressure Pb at point B is 2.4 MPa.

In regard to the above matter, supplementary explanation is given below. The refrigerant pressure is generally controlled by adjusting the opening of an expansion valve. However, the direct expansion type refrigeration cycle needs a low-pressure side (evaporator), which expands the refrigerant and absorbs heat by making use of evaporative latent heat, and a high-pressure side (condenser), which exhausts heat by compressing the refrigerant. Therefore, it is necessary that the refrigerant pressure in the refrigerant flow path be lower than the refrigerant pressure in the condenser. In other words, a common direct expansion type refrigeration cycle, which includes a compressor, a condenser, an expansion valve, and an evaporator, cannot theoretically compress the refrigerant in the evaporator. Therefore, the temperature control unit for an electrostatic adsorption electrode that uses a direct expansion type refrigeration cycle cannot readily adjust the refrigerant evaporation temperature to a high temperature, limits the refrigerant temperature control range to a low-temperature side, and is at a disadvantage in that it has a narrow operating temperature range. When the refrigerant cannot easily be compressed as in a common direct expansion type refrigeration cycle, the upper limit of the refrigerant evaporation temperature for R410 is approximately between 10° C. and 20° C.

Under the above circumstances, the present invention makes the refrigerant flow rate adjustable by providing the refrigerant flow path between the electrostatic adsorption electrode 1 and compressor 7 with a flow regulating valve 10, which functions as the second expansion valve. This makes it possible to compress the refrigerant in the refrigerant flow path 2, and adjust the wafer temperature to a high temperature by raising the refrigerant evaporation temperature. Consequently, the evaporation temperature of the refrigerant can be raised to the same level as for the condenser side. If, for instance, R410 (hydrofluorocarbon) is used as the refrigerant, control can be exercised to raise the evaporation temperature to a temperature as high as approximately 30° C. to 50° C.

When the flow regulating valve 10, which functions as the second expansion valve, is used to raise the evaporation temperature of the refrigerant in the refrigerant flow path 2, the temperature difference between the wafer W and refrigerant may decrease to reduce the degree of refrigerant evaporation (heat absorption), thereby letting the refrigerant return to the compressor 7 without being evaporated completely. If the refrigerant flows into the compressor 7 in a liquid state (while it is incompressible), the compressor 7 may become defective due to a motive power overload. It is therefore preferred that the refrigerant line between the second expansion valve 10 and compressor 7 be provided with the refrigerant heater 11 or other refrigerant heating device or a suction tank or other refrigerant vaporizer to evaporate the refrigerant completely.

The present embodiment provides a plasma processing apparatus having a temperature control unit that is capable of exercising wide-range control over the wafer temperature prevailing during a high-heat-input etching process, which is based on high wafer bias power application.

[Second Embodiment]

The plasma processing apparatus having a temperature control unit according to a second embodiment will now be described with reference to FIGS. 3A to 3C, 4A, and 4B. The second embodiment assumes that the plasma processing apparatus is configured as shown in FIG. 1.

Figure 3A:
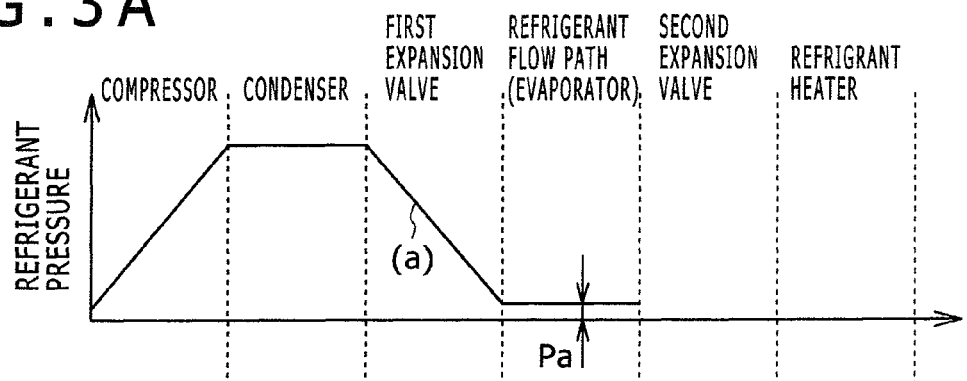
FIGS. 3A to 3C are schematic diagrams illustrating typical refrigerant pressure control operations that are performed by the temperature control unit according to a second embodiment of the present invention.
Figure 3B:
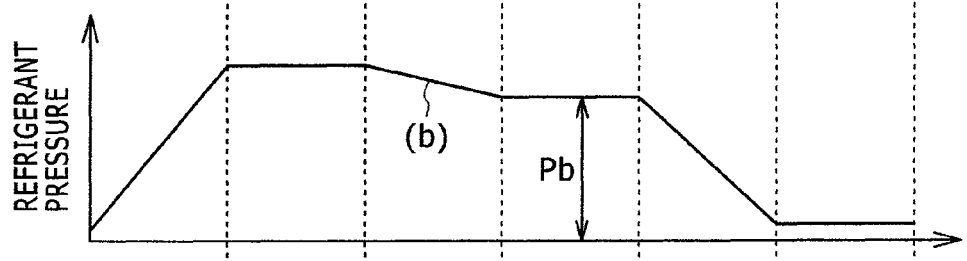
Figure 3C:
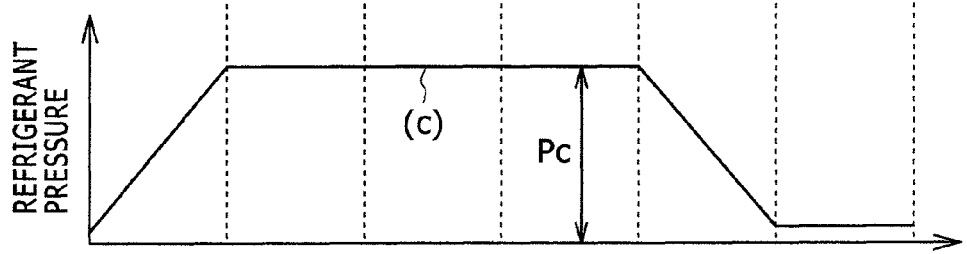
Figure 4A:
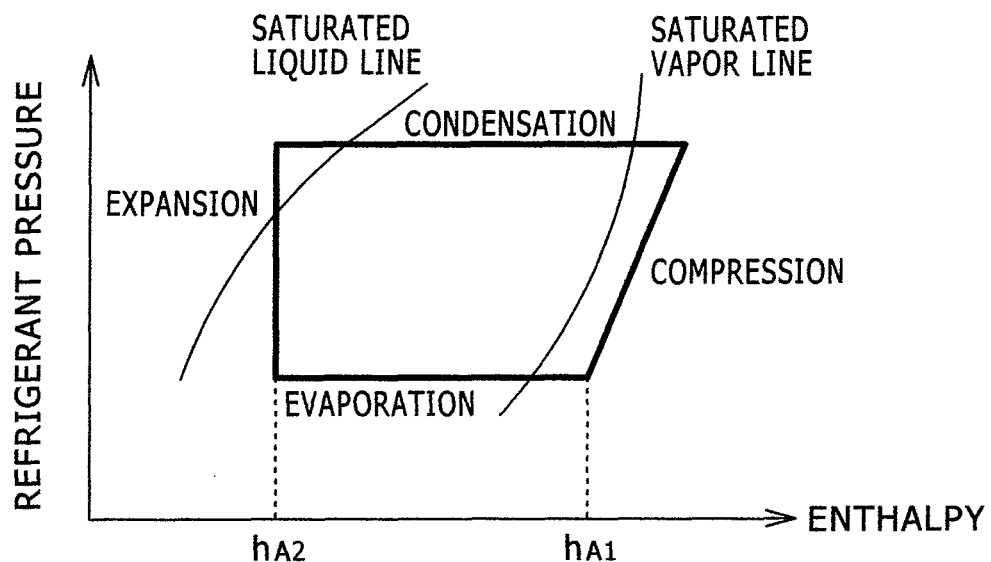
FIG. 4A is a schematic diagram illustrating a typical cooling capacity control operation that is performed by the temperature control unit according to the second embodiment of the present invention.
Figure 4B:
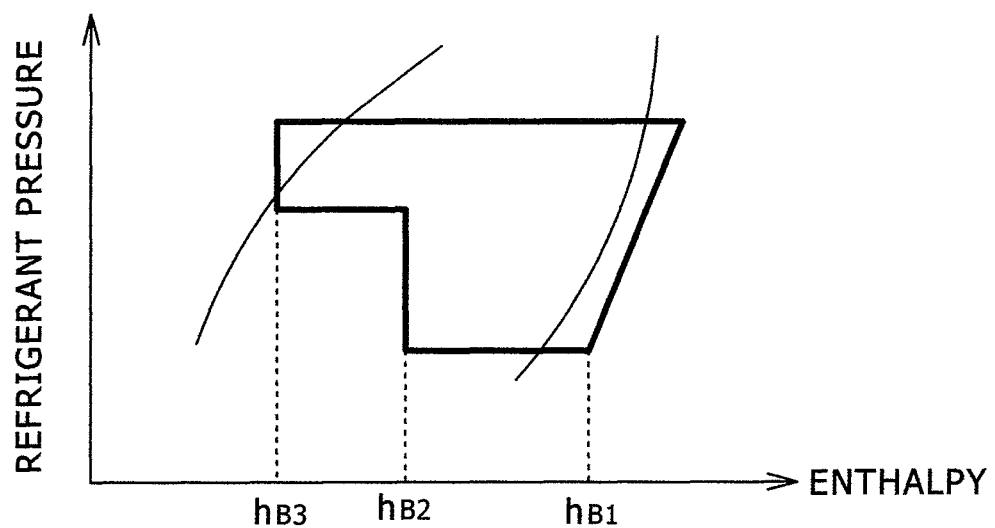
FIG. 4B is a schematic diagram illustrating a typical cooling capacity control operation that is performed by the temperature control unit according to the second embodiment of the present invention.

FIGS. 3A to 3C show typical refrigerant pressure control operations according to the present embodiment, and assumes that Pa<Pb<Pc. FIGS. 4A and 4B are Mollier diagrams illustrating the direct expansion type refrigeration cycle.

First of all, a control operation performed to adjust the temperature of the electrostatic adsorption electrode 1 to a medium- or low-temperature region will be described with reference to FIG. 3A and FIG. 4A. At first, direct expansion type refrigeration cycle characteristics (a), which are shown in FIG. 3A, will be described. The refrigerant is compressed by the compressor 7 to obtain a high-temperature liquid refrigerant (step 1). The condenser 8 provides air cooling or water cooling to exhaust the heat of the refrigerant (step 2). The first expansion valve 9 reduces the flow rate to lower the refrigerant pressure (refrigerant evaporation temperature) (step 3). The refrigerant evaporates in the refrigerant flow path 2 (step 4). Latent heat is used to absorb the heat of the wafer on the electrostatic adsorption electrode 1. In this situation, the opening of the first expansion valve is, for instance, approximately 50%. Meanwhile, the second expansion valve 10 is fully open and not functioning as an expansion valve. The refrigerant temperature is 60° C. at the inlet of the condenser 8 and approximately −20° C. to +20° C. at the inlet of the refrigerant flow path 2 in the electrostatic adsorption electrode 1. Therefore, the electrostatic adsorption electrode 1 is controlled within a medium- or low-temperature region.

The characteristics described above are the same as those of a common direct expansion type refrigeration cycle. FIG. 4A corresponds to FIG. 3A. Compression, condensation, expansion, and evaporation occur in the compressor 7, condenser 8, first expansion valve 9, and refrigerant flow path 2 (evaporator), respectively, and the refrigerant absorbs the enthalpy [KJ/Kg] of the difference between $h_{A1}$ and $h_{A2}$ in the refrigerant flow path 2.

A control operation performed to adjust the temperature of the electrostatic adsorption electrode 1 to a relatively high temperature region will now be described with reference to FIG. 3B and FIG. 4B. Characteristics (b), which are shown in FIG. 3B, are such that the refrigerant pressure is controlled by both the first expansion valve 9 and the second expansion valve 10. The flow rate reduction by the first expansion valve 9 is decreased, and the refrigerant pressure is lowered to a vaporization start pressure (adjusted to a pressure at which the refrigerant liquefied by compression begins to evaporate) so that the refrigerant evaporation temperature in the refrigerant flow path 2 is kept high. The second expansion valve 10 then drastically decreases the refrigerant pressure, and the refrigerant heater 11 completely evaporates the refrigerant that was insufficiently evaporated in the refrigerant flow path 2. Thus, the refrigerant pressure in the refrigerant flow path 2 can be adjusted to a pressure that is higher than provided by characteristics (a). This makes it possible to adjust the refrigerant evaporation temperature to a high temperature. For example, the opening of the first expansion valve 9 is approximately 50% to 90%, whereas the opening of the second expansion valve 10 is small. The refrigerant temperature is 60° C. at the inlet of the condenser 8, 50° C. at the inlet of the refrigerant flow path 2, and −20° C. to +20° C. at the inlet of the refrigerant heater 11. Consequently, control is exercised so that the electrostatic adsorption electrode 1 is maintained at a relatively high temperature.

FIG. 4B illustrates a cycle of the direct expansion type refrigeration cycle that is shown in FIG. 3B. The first expansion valve 9 and the second expansion valve 10 provide cooling by raising the refrigerant pressure in the refrigerant flow path 2 within a vaporization pressure region below a saturated liquid line. The section where the enthalpy is indicated by $h_{B2}$ and $h_{B3}$ represents an evaporation region of the refrigerant in the refrigerant flow path 2. The section where the enthalpy is indicated by $h_{B1}$ and $h_{B2}$ represents an evaporation region of the refrigerant that is provided by the refrigerant heater 11. More specifically, the evaporation temperature rises to reduce the temperature difference between the wafer W and refrigerant so that the absorbed enthalpy remains to be equivalent to the difference between $h_{B2}$ and $h_{B3}$ (the refrigerant does not completely evaporate). Therefore, the second expansion valve 10 lowers the refrigerant pressure, and the refrigerant heater 11 absorbs the enthalpy of the difference between $h_{B1}$ and $h_{B2}$ to evaporate the refrigerant completely.

The cooling capacity [kW] of the direct expansion type refrigeration cycle can be calculated by multiplying the absorbed enthalpy [kJ/kg] by the mass flow rate [kg/s] of the refrigerant.

A case where the temperature of the electrostatic adsorption electrode 1 is raised (heating cycle) will now be described with reference to FIG. 3C. In this case, the first expansion valve 9 is fully opened so that the second expansion valve 10 is capable of lowering the pressure. This makes it possible to ensure that the same refrigerant pressure prevails in the condenser 8 and refrigerant flow path 2 as indicated by characteristics (c), which are shown in FIG. 3C. More specifically, the refrigerant is evaporated by the heat of the refrigerant heater 11 and compressed in the refrigerant flow path 2 to exhaust heat so that the refrigerant flow path 2 functions as a heater. This makes it possible to construct a defrost cycle that heats the electrostatic adsorption electrode 1 when, for instance, temperature control is exercised before the start of plasma processing. For example, the refrigerant temperature is 50° C. to 60° C. at the inlet of the refrigerant flow path 2. In a heating cycle, the cooling water supply to the condenser 8 is shut off.

The present embodiment provides a plasma processing apparatus having an electrostatic absorption electrode temperature control unit that is capable of exercising high-speed, wide-range control over the wafer temperature prevailing during a plasma process, and more particularly, during a high-heat-input etching process, which is based on high wafer bias power application, by controlling the rotation speed of the compressor 7 and the openings of the first expansion valve 9 and second expansion valve 10.

[Third Embodiment]

A third embodiment of the present invention will now be described with reference to FIGS. 5A to 5D. The third embodiment is obtained by modifying a thin-walled cylindrical flow path structure of the plasma processing apparatus having a temperature control unit according to the first embodiment. In the direct expansion type refrigeration cycle, the evaporation temperature can be controlled at 1-second intervals by adjusting the refrigerant pressure. When these characteristics are to be used to exercise high-speed control over the wafer temperature, it is necessary to reduce the heat transfer loss between the wafer W and refrigerant flow path 2. In other words, it is necessary to decrease the heat capacity of the electrostatic adsorption electrode 1 on which the wafer W is to be mounted. It is conceivable that the heat capacity of the electrostatic adsorption electrode 1 may be decreased, for instance, by reducing its mass or by changing its constituent material to a low-heat-capacity material. However, the constituent material cannot readily be changed because it is necessary to consider electrical characteristics, constituents (which might incur internal contamination of the chamber), and various other factors in addition to heat characteristics.

Under the above circumstances, a practical method for reducing the heat capacity would be to reduce the mass of the electrostatic adsorption electrode 1. However, reducing the mass decreases the constituent material thickness, thereby incurring a decrease in mechanical strength (rigidity). Since the adsorption force of the electrostatic adsorption electrode 1 largely depends on the condition of an adsorption surface, it is anticipated that the amount of deformation might be increased by a decrease in rigidity.

Further, the direct expansion type refrigeration cycle is characterized by the fact that the refrigerant pressure is high. When, for instance, R410 (hydrofluorocarbon) is to be used as the refrigerant and evaporated at 40° C., it is necessary to raise the refrigerant pressure to approximately 2.4 MPa. This pressure value is approximately five times that of a conventional liquid refrigerant system. Therefore, when the direct expansion type refrigeration cycle is used to control the wafer temperature at high speed, it is necessary to solve the above tradeoff problem.

Figure 5A:
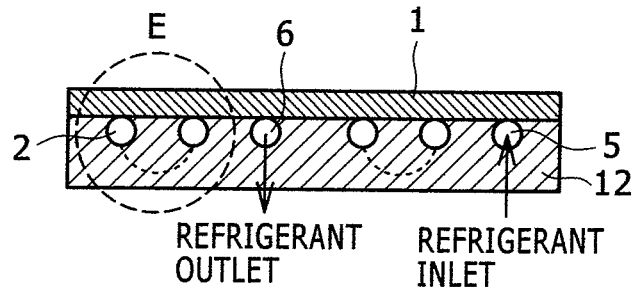
FIG. 5A is a schematic diagram illustrating the configuration of the temperature control unit according to a third embodiment of the present invention.
Figure 5B:
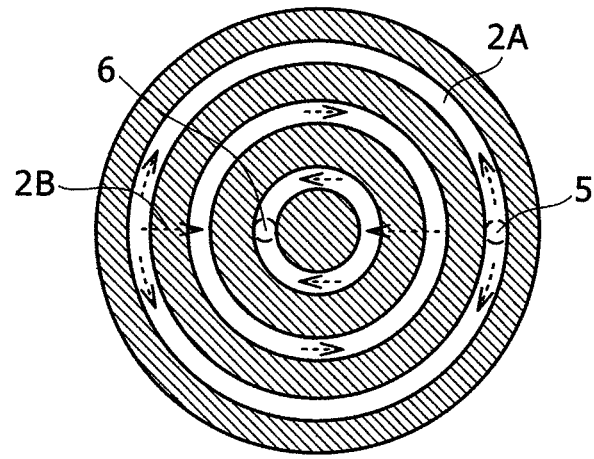
FIG. 5B is a schematic diagram illustrating the structure of a refrigerant flow path according to the third embodiment of the present invention.

Under the above circumstances, a refrigerant flow path 2 having a thin-walled cylindrical structure is employed for the electrostatic adsorption electrode 1 so that the thin-walled cylinder is deformed only slightly by the refrigerant pressure. FIG. 5A is a longitudinal cross-sectional view of the electrostatic adsorption electrode 1. FIG. 5B is a transverse cross-sectional view of the refrigerant flow path 2 embedded in the base material 12. The refrigerant flow path 2 includes a plurality of concentric circular flow paths 2A having a circular cross section and a communication flow path 2B having a circular cross section. A refrigerant inlet 5 is connected to the outermost circular flow path 2A, whereas a refrigerant outlet 6 is connected to the innermost circular flow path 2A. An adjacent circular flow path 2A is connected to the communication flow path 2B as indicated by an arrow in FIG. 5B. A manufacturing method is to join or bond the thin-walled cylinder, which constitutes the refrigerant flow path 2, to the electrostatic adsorption electrode 1 and mold Teflon (registered trademark) or other resin to the top of them to form the base material 12.

Referring to FIG. 5B, the refrigerant that flows into the outermost circular flow path 2A of the refrigerant flow path 2 from the refrigerant inlet 5 on the right-hand side separates into two, converges in the communication flow path 2B on the left-hand side, flows into the inner circular flow path 2A, and eventually flows out of the refrigerant flow path 2 through the innermost circular flow path 2A and refrigerant outlet 6.

For design purposes, any material can be employed for the thin-walled cylinder constituting the refrigerant flow path 2 according to the present invention. However, if the material of the thin-walled cylinder constituting the refrigerant flow path 2 differs from that of the electrostatic adsorption electrode 1, thermal stress arises due to the difference between their thermal expansion coefficients. It is therefore desirable that the thin-walled cylinder and electrostatic adsorption electrode 1 be made of the same material. For example, aluminum can be used as their material. From the viewpoint of workability, it is desirable that the thickness of the thin-walled cylinder be 0.3 mm to 3 mm. Further, the inner wall of the refrigerant flow path 2 should include surface irregularities whose height is approximately 2 to 10% relative to the width of the refrigerant flow path 2 for the purpose of promoting the heat transfer of the refrigerant.

Figure 5C:
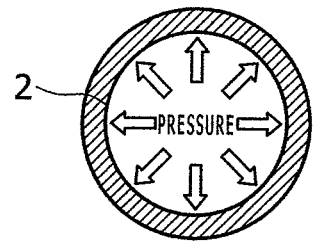
FIG. 5C is a schematic diagram illustrating the function of the refrigerant flow path according to the third embodiment of the present invention.

Since the refrigerant flow path for the electrostatic adsorption electrode has a thin-walled cylindrical structure, it is possible to suppress the deformation of the electrostatic adsorption electrode 1 and maintain the electrostatic adsorption force of the wafer as indicated in FIG. 5C even when high pressure is exerted due to refrigerant compression. Further, as the electrode structure can be simplified, it is possible to reduce the heat capacity (mass) of the electrostatic adsorption electrode 1, thereby providing improved temperature control capability.

When, for instance, A5052, which is a common aluminum material, is employed to build a conventional electrode structure in which a refrigerant flow path having a rectangular cross section is formed by bolting a flat plate to a plate having a concave groove, and a refrigerant pressure of 2.5 MPa is applied to a 360 mm diameter, 30 mm thick member whose outer circumference is fixed, the member suffers a deformation of up to 230 μm (central portion). When, on the other hand, the thin-walled cylindrical structure according to the present invention is employed, the calculation performed of a case where a ¼-inch A5052 pipe (having a wall thickness of 0.8 mm) is used indicates that the diameter deformation of the cylinder constituting the refrigerant flow path is 0.5 μm. Moreover, the diameter deformation of the cylinder constituting the refrigerant flow path does not substantially affect the electrostatic adsorption electrode 1. Consequently, the electrostatic adsorption electrode 1 can maintain satisfactory adsorption force.

Figure 5D:
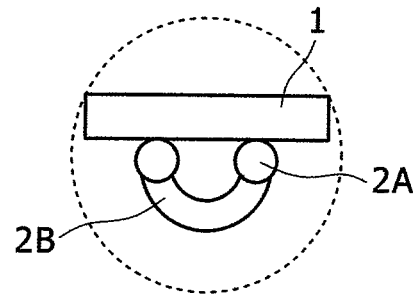
FIG. 5D is a schematic diagram illustrating the structure of a communication flow path according to the third embodiment of the present invention.

Further, since the thin-walled cylindrical structure permits the refrigerant flow path 2 to be installed independently of the electrostatic adsorption electrode 1, it is possible to improve the in-plane temperature uniformity of the wafer W by providing thermal insulation for a flow path unnecessary for cooling in the electrostatic adsorption electrode 1 (by separating such a flow path from the electrostatic adsorption electrode 1). The above scheme will be described with reference to FIG. 5D. FIG. 5D shows an enlarged detail of section E in FIG. 5A.

Referring to FIG. 5B, the communication flow path is required in addition to the circular flow path while the refrigerant flows from the refrigerant inlet 5 to the refrigerant outlet 6. However, a locally installed communication flow path is not needed from the viewpoint of wafer temperature uniformity. In such an instance, the wafer's in-plane temperature can be maintained uniform when the communication path 2B is installed independently of the electrostatic adsorption electrode 1 as shown in FIG. 5D. More specifically, the communication flow path 2B is positioned below the circular flow path 2A, that is, positioned inside the base material 12, which is separate from the electrostatic adsorption insulation thin film, to connect the neighboring two circular paths 2A. The use of the above three-dimensional junction structure makes it possible to install the refrigerant flow path independently of the electrostatic adsorption electrode. Consequently, thermal insulation can be provided for a flow path unnecessary for cooling in the electrostatic adsorption electrode to reduce the wafer's in-plane temperature difference.

The positions of the refrigerant inlet 5 and refrigerant outlet 6, which are shown in FIGS. 5A and 5B, may be interchanged.

Further, the use of a thin-walled cylindrical refrigerant flow path for the electrostatic adsorption electrode makes it possible to suppress the deformation of the electrostatic adsorption electrode and maintain the wafer's electrostatic adsorption force even when high pressure is applied to compress the refrigerant. Furthermore, since the electrode flow path structure can be simplified, it is possible to reduce the heat capacity (mass) of the electrostatic adsorption electrode, thereby providing improved temperature control capability. Moreover, since the refrigerant flow path can be installed independently of the electrostatic adsorption electrode, it is possible to reduce the wafer's in-plane temperature difference by providing thermal insulation for a flow path unnecessary for cooling in the electrostatic adsorption electrode.

As described above, the present embodiment provides a plasma processing apparatus having an electrostatic adsorption electrode temperature control unit that is capable of controlling the wafer temperature at high speed over a wide temperature range without affecting in-plane uniformity while high heat input etching is conducted with high wafer bias power applied.

[Fourth Embodiment]

Figure 6A:
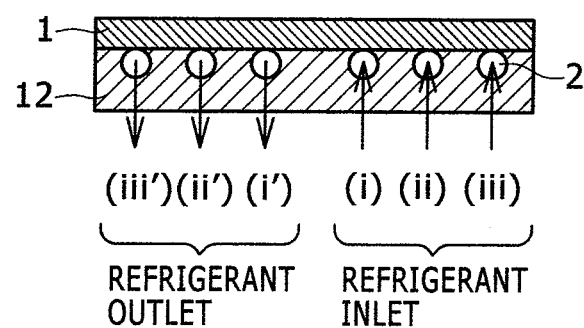
FIG. 6A is a schematic diagram illustrating a typical in-plane temperature distribution control operation that is performed by the temperature control unit according to a fourth embodiment of the present invention.
Figure 6B:
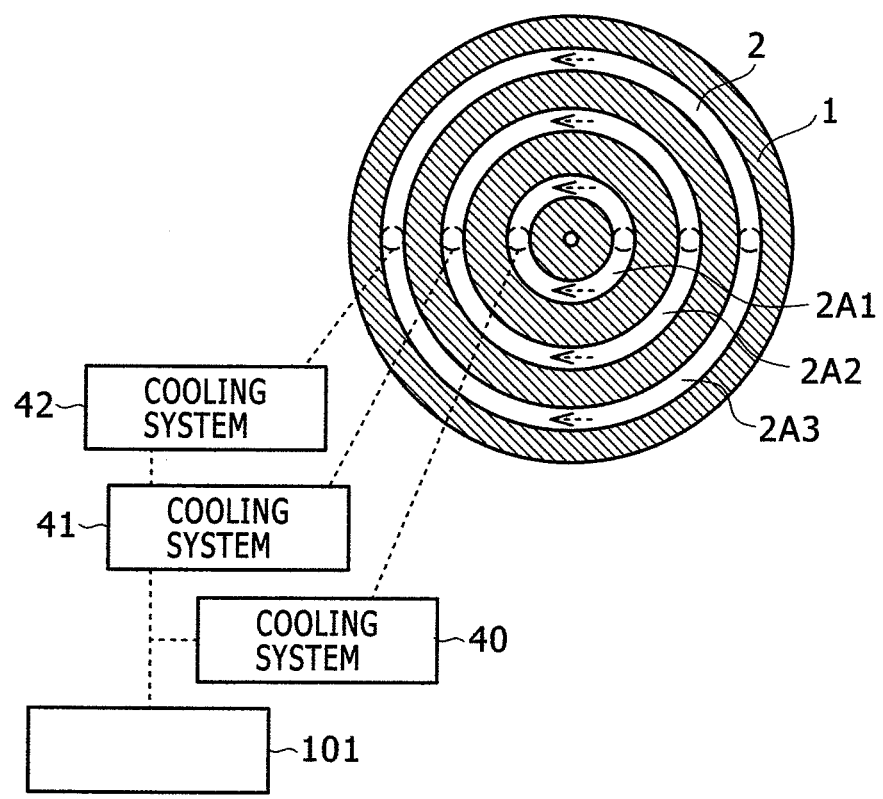
FIG. 6B is a schematic diagram illustrating the structure of a refrigerant flow path according to the fourth embodiment of the present invention.

A fourth embodiment of the present invention will now be described with reference to FIGS. 6A and 6B. FIG. 6A is a longitudinal cross-sectional view of the electrostatic adsorption electrode 1. FIG. 6B is a transverse cross-sectional view of the refrigerant flow path 2 that is provided in the base material 12.

When high-frequency power is applied to the electrostatic adsorption electrode 1, plasma may be generated on a back surface of the electrostatic adsorption electrode 1. Therefore, the base material 12 made of an electrical insulator needs to be mounted on the back surface. It is preferred that the material for the base material 12 made of an insulator be Teflon or the like. Since Teflon has a low thermal conductivity, it is expected that the base material 12 made of Teflon also function as a thermal insulator.

A method for controlling the wafer's in-plane temperature distribution by using the thin-walled cylindrical flow path structure will now be described with reference to FIGS. 6A and 6B. When a thin-walled cylindrical refrigerant flow path 2 is employed as described in conjunction with the third embodiment while covering the back surface of the electrostatic adsorption electrode 1 with the base material 12 that is made of an electrical insulator/thermal insulator, the flow paths are thermally insulated from each other. In the fourth embodiment, a plurality of concentric circular flow paths 2A1, 2A2, 2A3 are independently formed in the base material 12 as shown in FIG. 6B. These circular flow paths 2A1, 2A2, 2A3 are respectively connected to refrigerant inlets (i), (ii) and (iii), which are radially lined up on the right-hand side as viewed in FIG. 6B. Further, the circular flow paths 2A1, 2A2, 2A3 are respectively connected to refrigerant outlets (i'), (ii') and (iii'), which are radially lined up on the left-hand side as viewed in FIG. 6B. The circular flow paths 2A1, 2A2, 2A3 are respectively configured as parts of independent direct expansion type refrigeration cycles 40, 41, 42. In other words, the present embodiment does not need the communication flow path.

As shown in FIG. 6A, the wafer's in-plane temperature distribution can be arbitrarily controlled by controlling the evaporation temperature of the refrigerant that flows to the circular path of each direct expansion type refrigeration cycle, that is, by exercising control as indicated in FIG. 3.

The present embodiment employs a thin-walled cylindrical refrigerant flow path 2 so that the thin-walled cylinder is deformed only slightly by the refrigerant pressure. The use of this structure makes it possible to suppress the deformation of the electrostatic adsorption electrode 1 even when high pressure is applied to compress the refrigerant. Consequently, the present embodiment provides an electrostatic adsorption electrode temperature control unit that is capable of controlling the wafer temperature at high speed over a wide temperature range without affecting in-plane uniformity while high heat input etching is conducted with high wafer bias power applied.

[Fifth Embodiment]

Figure 7A:
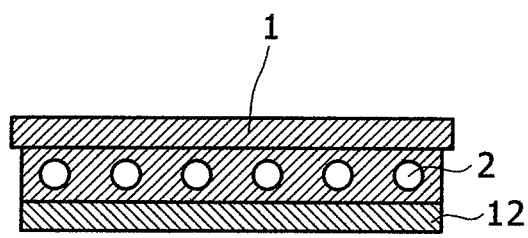
FIG. 7A is a schematic diagram illustrating the configuration of the temperature control unit according to a fifth embodiment of the present invention.
Figure 7B:
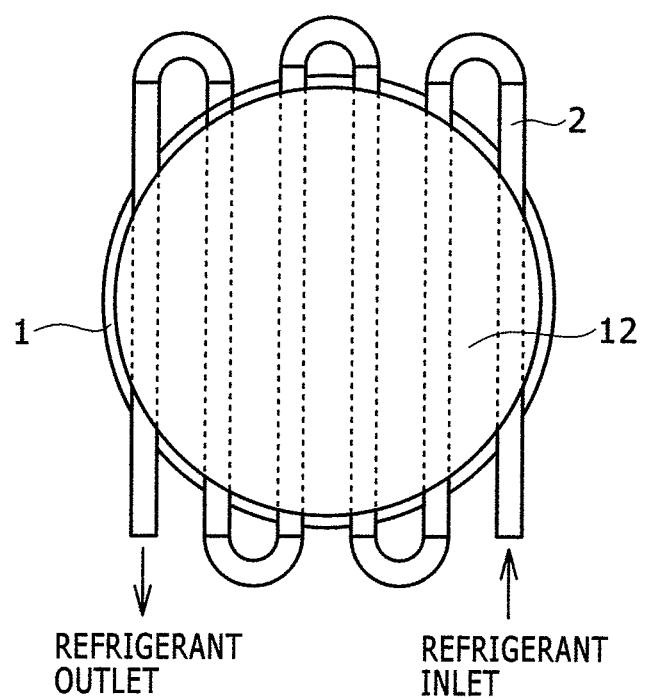
FIG. 7B is a schematic diagram illustrating a typical structure of the refrigerant flow path according to the fifth embodiment of the present invention.

A fifth embodiment of the present invention will now be described with reference to FIGS. 7A and 7B. In the fifth embodiment, a thin-walled cylindrical flow path is embedded in the electrostatic adsorption electrode 1. FIG. 7A is a longitudinal cross-sectional view of the electrostatic adsorption electrode 1. FIG. 7B is a rear view of the electrostatic adsorption electrode, which shows how the refrigerant flow path 2 is configured.

In the foregoing embodiments, the base material 12 having the refrigerant flow path 2 and the electrostatic adsorption electrode 1 are separate members and joined together by welding or adhesion. However, the present invention is not limited to the use of such a refrigerant flow path configuration.

For example, a thin-walled cylindrical refrigerant flow path 2 can be embedded in the electrostatic adsorption electrode 1 as shown in FIGS. 7A and 7B, for instance, by swaging to form an integral structure. The electrostatic adsorption electrode 1 and the base material 12 made of an electrical insulator/thermal insulator are joined together, for instance, by welding or adhesion. In the example shown in FIGS. 7A and 7B, the refrigerant flow path 2 is configured as a single continuous flow path.

The present embodiment also provides an electrostatic adsorption electrode temperature control unit that is capable of controlling the wafer temperature at high speed over a wide temperature range without affecting in-plane uniformity while high heat input etching is conducted with high wafer bias power applied.

[Sixth Embodiment]

A sixth embodiment of the present invention will now be described with reference to process timing diagrams in FIGS. 8A to 8F. FIGS. 8A to 8F show typical processes that are performed for thin-film etching. The sixth embodiment relates to a process for etching a thin film actually formed on the wafer W through the use of the plasma processing apparatus having the direct expansion type refrigeration cycle shown in FIG. 1 and the thin-walled cylindrical flow path structure shown in FIGS. 5A to 5D.

The thin film to be subjected to plasma processing may be, for instance, a single film having a main constituent, such as $SiO_2$, $Si_3N_4$, SiOC, SiOCH, or SiC, or a multilayer film having two or more types of film.

In FIG. 8, FIG. 8A outlines how the plasma processing apparatus transports the wafer W and performs a processing process; FIG. 8B shows timing with which the bias power supply 22 applies a bias; FIG. 8C shows an operating state of the compressor in the direct expansion type refrigeration cycle; FIG. 8D shows the opening of the first expansion valve; FIG. 8E shows how the wafer heater is turned on/off; and FIG. 8F shows the opening of the second expansion valve.

The wafer W is loaded into the processing chamber 100 from a sample transport device (not shown), mounted on the electrostatic adsorption electrode 1, and secured. In this state, the temperatures of the electrostatic adsorption electrode 1 and other relevant items are adjusted. If inter-process temperature control needs to be exercised, the second expansion valve 10 is controlled to raise the evaporation temperature of the direct expansion type system and decrease the cooling capacity. The electrostatic adsorption electrode 1 is then heated by the wafer heater 3 in the resulting state to preheat the wafer W. In this instance, control is exercised to rotate the compressor 7 at low speed, open the first expansion valve 9 to a great extent, open the second expansion valve 10 to a small extent, and turn on the wafer heater 3. An alternative method for exercising inter-process temperature control would be to switch the direct expansion type system to a heating cycle by controlling the second expansion valve 10 and refrigerant heater 11 and preheat the electrostatic adsorption electrode 1. In this instance, the refrigerant heater 11 is used as a heat source.

Next, a process gas required for wafer etching is supplied from a process gas supply system (not shown), and the evacuation system 20 adjusts the processing chamber 100 to a predetermined process pressure. Plasma is then generated in the processing chamber 100 due to the power supplied from the antenna power supply 21, and controlled by bias power supply 22 and a magnetic field (not shown). Consequently, an etching processing is started in relation to the wafer on the electrostatic adsorption electrode 1.

For wafer temperature control during processing, the temperature control system 101 exercises feedback control while monitoring the temperature information supplied from the temperature sensor 4, and adjusts the refrigerant flow rate, the evaporation temperature, and the thermal dose of the wafer heater 3 by adjusting the compressor 7, the first expansion valve 9, the second expansion valve 10, and the wafer heater 3.

In the above instance, the compressor 7, the first expansion valve 9, and the second expansion valve 10 can control the refrigerant evaporation temperature within the refrigerant flow path 2 over a wide range, for instance, from −20° C. to +50° C. When, for instance, the plasma heat input is high in a certain process step, the cooling capacity for the wafer W is increased by raising the rotation speed of the compressor 7, opening the first expansion valve 9 to a small extent, and fully opening the second expansion valve 10. When, on the other hand, the plasma heat input is low, the cooling capacity for the wafer W is decreased by lowering the rotation speed of the compressor 7, opening the first expansion valve 9 to a great extent, and opening the second expansion valve 10 to a medium extent.

As described above, the present invention is applicable to high-heat-input processing conditions where high-frequency power of not lower than 3 W/cm is applied to the wafer W, and effective for processing deep holes with an aspect ratio of 15 or higher.

Further, as shown in FIG. 6A and 6B, the in-plane temperature distribution of the electrostatic adsorption electrode 1 can be controlled by using a plurality of refrigerant flow paths 2 with a thermal insulation member installed between the flow paths and controlling the evaporation temperature of the refrigerant that flows to each refrigerant flow path 2. This makes it possible to control the overall in-plane temperature of the wafer W rapidly over a wide temperature range while high heat input etching is conducted with high wafer bias power applied.

Etching is completed by performing the above process, and then the supplies of power, magnetic field, and process gas are shut off.

It goes without saying that the present invention is effective for a method of applying high-frequency power to the electrode facing the wafer W while applying different high-frequency power to the wafer W, an inductive coupling method, a method of interaction between magnetic field and high-frequency power, and a method of applying high-frequency power to the electrostatic adsorption electrode 1.

[Seventh Embodiment]

A seventh embodiment of the present invention will now be described with reference to FIGS. 9 and 10.

In the direct expansion type system, the refrigerant absorbs heat and flows while evaporating in the refrigerant flow path 2. Therefore, the heat transfer coefficient of the refrigerant changes in accordance with a phase change from liquid to gas. This makes it difficult to assure the in-plane uniformity of the surface temperature of the electrostatic adsorption electrode 1, and thus the in-plane uniformity of the temperature of the wafer W. Consequently, it is necessary to maintain a uniform heat transfer coefficient of the refrigerant in the refrigerant flow path 2 by optimizing the cross-sectional area of the refrigerant flow path 2 and controlling the flow velocity of the refrigerant.

Figure 9:
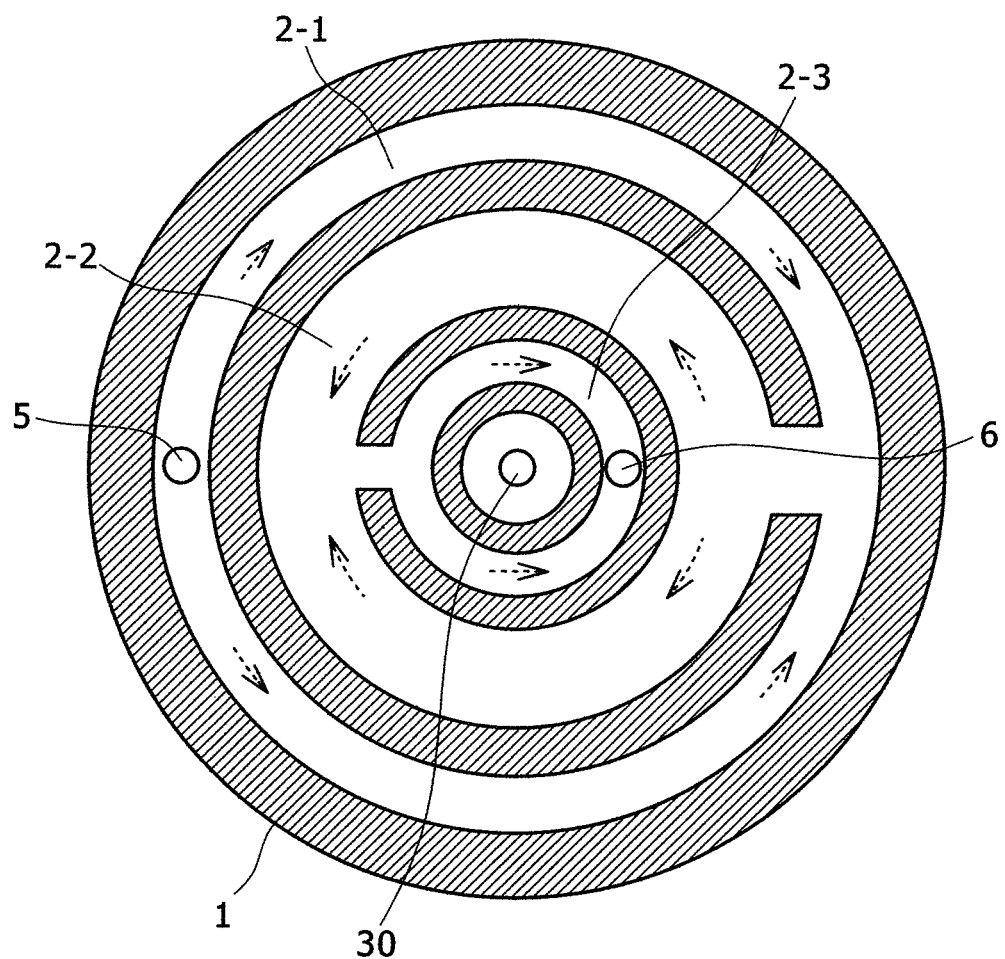
FIG. 9 is a schematic diagram illustrating a typical structure of the refrigerant flow path according to a seventh embodiment of the present invention.
Figure 10:
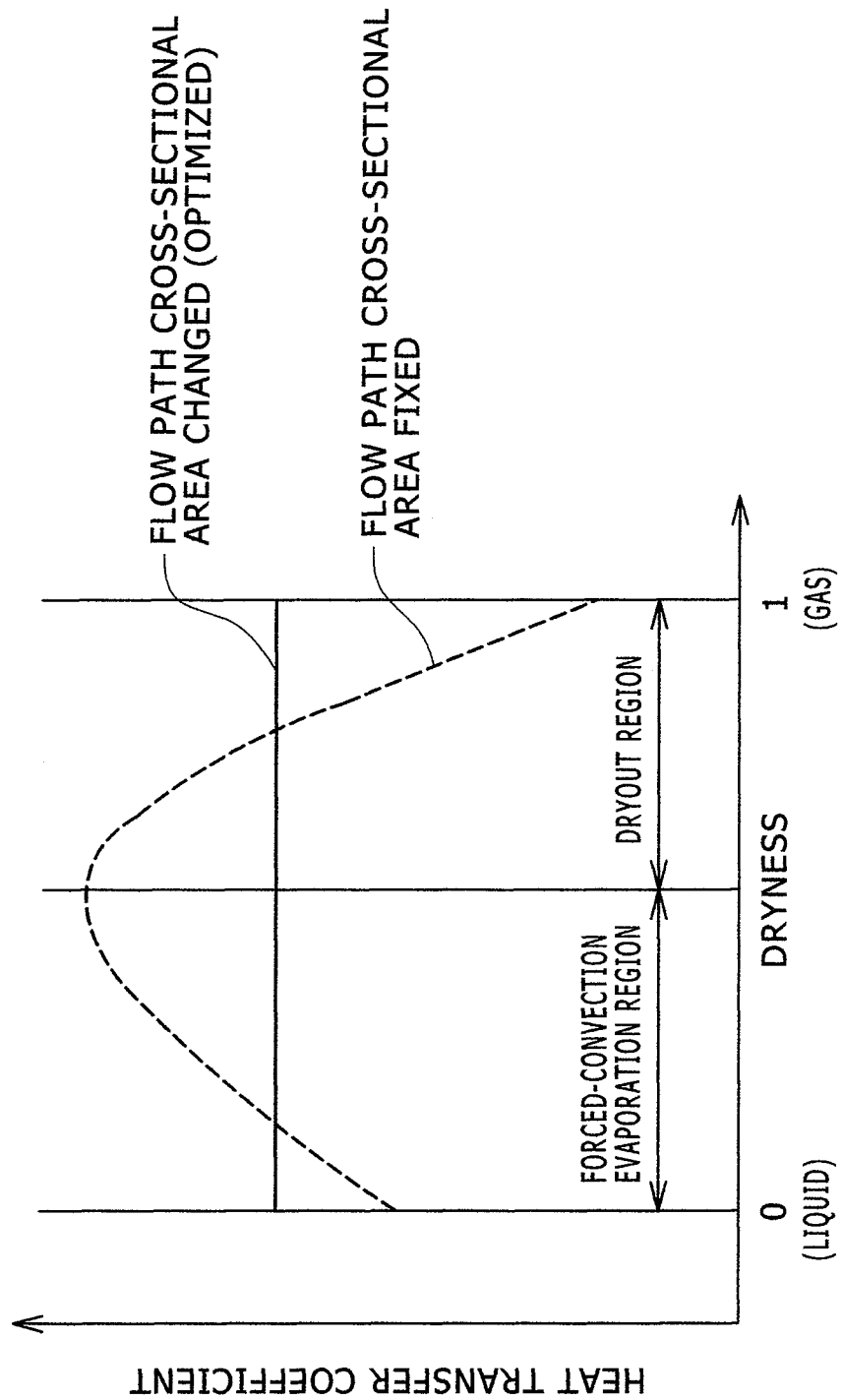
FIG. 10 is a schematic diagram illustrating the heat transfer characteristics of a refrigerant according to the seventh embodiment of the present invention.
Figure 11:
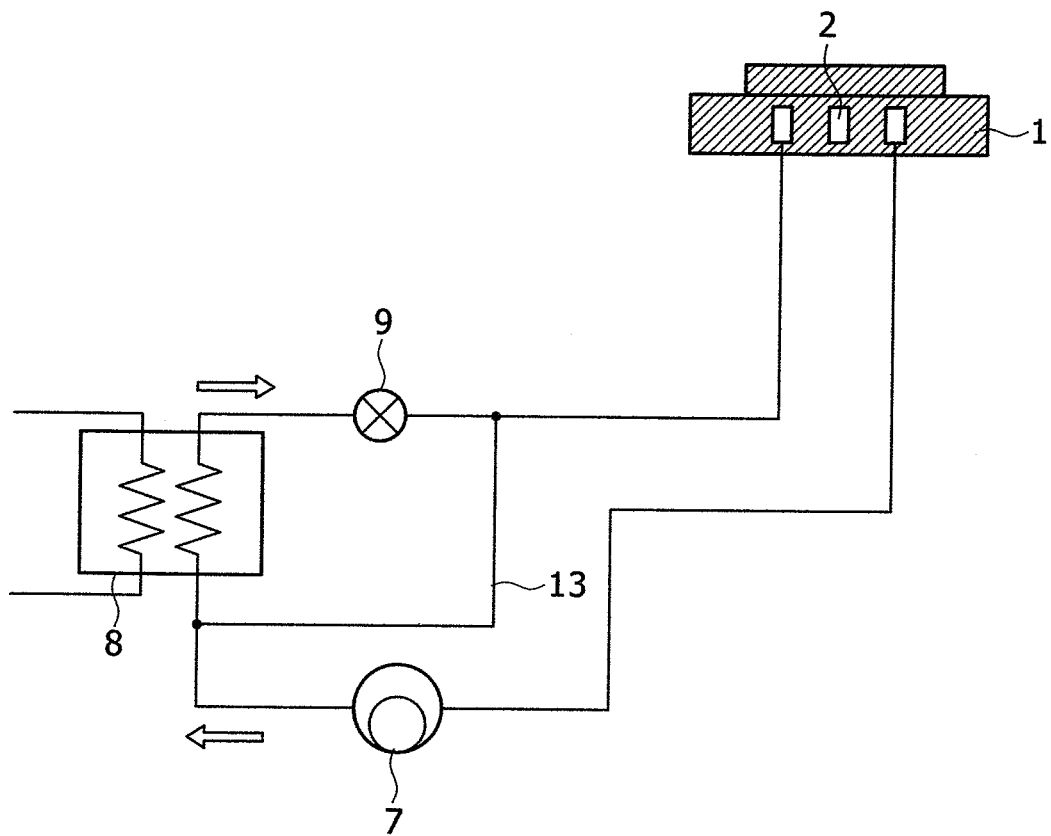
FIG. 11 is a schematic diagram illustrating a typical conventional structure for raising the refrigerant evaporation temperature to a high level.

FIG. 9 shows an example in which the flow path cross-sectional area is optimized. FIG. 10 shows the heat transfer characteristics of the refrigerant.

When, for instance, R410 refrigerant is used to cool the electrostatic adsorption electrode 1, the heat transfer coefficient decreases in a region where dryness is low and a region where dryness is high. Therefore, it is possible to suppress the decrease in the heat transfer coefficient by reducing the flow path cross-sectional area in the above two regions and raising the flow velocity of the refrigerant. More specifically, the flow rate cross-sectional area of an intermediate circular flow path 2-2 is made larger than those of outer and inner circular flow paths 2-1, 2-3.

In the region where dryness is high, the heat transfer coefficient decreases due to dryout (the loss of a liquid film). When the electrostatic adsorption electrode 1 is to be cooled without using the region where dryness is high, the employed construction should be such that the cross-sectional area of the refrigerant flow path 2 continuously increases from the inlet to the outlet. Any insufficiently evaporated refrigerant should be completely evaporated by using, for instance, the refrigerant heater 11.

When the employed structure is such that the cross-sectional area of the refrigerant flow path 2 is optimized as described above, the dryness of the refrigerant flowing in the refrigerant flow path 2 should remain constant at all times. More specifically, when the evaporation temperature of the refrigerant is raised, the amount of heat absorbed by the refrigerant should not decrease to change the dryness (degree of evaporation) of the refrigerant. Therefore, when, for instance, the cooling capacity is to be decreased by raising the evaporation temperature of the refrigerant, the rotation speed of the compressor 7 should be decreased to reduce the amount of refrigerant circulation and let the second expansion valve 10 control the evaporation temperature (refrigerant pressure). When the refrigerant circulation amount is controlled in accordance with heat input, the same dryness can always be reproduced in the refrigerant flow path 2. Thus, the in-plane temperature of the electrostatic adsorption electrode 1 can be maintained uniform.

It is needless to say that the thin-walled cylindrical flow path structure according to the present invention is also effective for a liquid refrigerant system in which the refrigerant flow rate is increasing to improve the cooling capacity, thereby inevitably allowing the refrigerant pressure to increase.

The temperature control unit for the plasma processing apparatus proposed by the present invention is not limited to the use in the foregoing embodiments. The present invention is also applicable to a temperature control device that serves as a wafer holding table for an ashing device, sputtering device, ion implantation device, resist application device, plasma CVD device, and the like, and needs to exercise wafer temperature control in accordance, for instance, with plasma heat input during processing. As regards a wafer processing apparatus, the present invention can also be applied not only to a vacuum processing apparatus that processes wafers in a vacuum environment but also to a processing apparatus that processes wafers in an atmospheric environment. Further, the present invention can also be applied not only to a wafer holding table but also to a processing chamber wall structure or other temperature control device that needs to exercise temperature control in accordance, for instance, with plasma heat input during processing.

The sample holding table on which a wafer or other sample is to be mounted is not limited to an electrostatic adsorption electrode. It may also be a sample holding table that is capable of retaining a sample by using a vacuum or in a different manner.

What is claimed is:

1. A plasma processing apparatus for processing a wafer mounted on a sample holding table using a plasma which is generated in a processing chamber, the sample holding table being disposed in the processing chamber, the plasma processing apparatus comprising:
a refrigeration cycle including a compressor, a condenser, a first expansion valve, a flow path for refrigerant in the sample holding table having an inlet and an outlet which are provided in the sample holding table, a second expansion valve and a refrigerant heater,
wherein the compressor, the condenser, the first expansion valve, the flow path for refrigerant, the second expansion valve and the refrigerant heater being connected by refrigerant lines in this order and constituting an overall refrigerant flow path in which the refrigerant circulates in the order and is evaporated or condensed, and
wherein the compressor, the condenser, and the refrigerant heater of the refrigeration cycle are disposed outside of the processing chamber, and the refrigeration cycle has the first expansion valve connected between the condenser and the inlet of the flow path for the refrigerant in the sample holding table and the second expansion valve connected between the outlet of the flow path for the refrigerant in the sample holding table and the refrigerant heater, and is configured to operate the flow path for refrigerant as a cooler of the sample holding table where the refrigerant is evaporated to vapor in the flow path and as a heater of the sample holding table where the refrigerant is condensed to liquid in the flow path, while the refrigerant circulates in the refrigeration cycle including the refrigerant lines in the same direction along said order,
the plasma processing apparatus further comprising:
a temperature control means for controlling a temperature of the sample holding table so as to be a predetermined value of the temperature by adjusting operation of the first expansion valve and the second expansion valve based on the detected result of the temperature of the refrigerant flowing in the flow path in the sample holding table during both of the operation of the refrigerant flow path provided in the sample holding table as the cooler of the sample holding table and the operation of the refrigerant flow path as the heater of the sample holding table, or a shifting of operation of the refrigerant flow path between the operation as the cooler and the operation as the heater, the adjustment of the operation of the first expansion valve and the second expansion valve by the temperature control means including adjusting concurrently opening degrees of the first expansion valve and the second expansion valve during the operation of the refrigerant flow path as the cooler of the sample holding table and operation as the heater of the sample holding table and the shifting of operation of the refrigerant flow path provided in the sample holding table between the operation as the cooler of the sample holding table and the operation as the heater of the sample holding table, the opening degree of the first expansion valve being increased and the opening degree of the second expansion valve being decreased for the higher temperature of the sample holding table or the refrigerant in the refrigerant flow path in the sample holding table, and the opening degree of the first expansion valve being decreased and the opening degree of the second expansion valve being increased for the lower temperature of the sample holding table or the refrigerant in the refrigerant flow path in the sample holding table.

2. The plasma processing apparatus according to claim 1, wherein the plasma processing apparatus comprises a gas introduction section for introducing a process gas into the processing chamber, the processing chamber having an evacuation section, and a plasma generating means for turning the process gas into the plasma, and
wherein the sample holding table provided in the processing chamber is an electrostatic adsorption electrode.

3. The plasma processing apparatus according to claim 2, wherein the electrostatic adsorption electrode and the refrigerant flow path are made of the same material.

4. The plasma processing apparatus according to claim 1, wherein each of the first expansion valve and the second expansion valve is variable capacity valve.

5. A plasma processing apparatus according to claim 1, wherein the plasma processing apparatus further comprises a temperature sensor which detects a temperature of the refrigerant flowing in the flow path for refrigerant in the holding table, and wherein the temperature control means controls a pressure of the refrigerant in the flow path for the refrigerant in the sample holding table by adjusting concurrently opening degrees of the first expansion valve and the second expansion valve based upon the output of the temperature sensor, the refrigerant flow path inside the sample holding table functioning by control of the temperature control means as either the evaporator or the condenser in the refrigeration cycle.

6. A plasma processing apparatus according to claim 1, wherein the plasma processing apparatus further comprises a temperature sensor which detects a temperature of the refrigerant flowing in the flow path for refrigerant in the sample holding table, wherein the temperature control means adjusts concurrently opening degrees of the first expansion valve and the second expansion valve based upon the output of the temperature sensor, the flow of the refrigerant inside the flow path for refrigerant in the sample holding table, by control by the temperature control means, being made a gas-liquid mixed flow.

7. A plasma processing apparatus according to claim 1, which further comprises a heater which is disposed above the refrigerant flow path inside the sample holding table and is supplied with electrical power.

* * * * *